United States Patent [19]

Moy

[11] Patent Number: 4,682,018

[45] Date of Patent: Jul. 21, 1987

[54] PROCESS FOR THE TEMPERATURE COMPENSATION OF A PHOTOCONDUCTING DETECTOR

[75] Inventor: Jean P. Moy, St. Egreve, France

[73] Assignee: Thomson-CSF, Paris, France

[21] Appl. No.: 686,870

[22] Filed: Dec. 27, 1984

[30] Foreign Application Priority Data

Jan. 3, 1984 [FR] France ............................. 84 00030

[51] Int. Cl.[4] .......................................... H01J 40/14
[52] U.S. Cl. ............................................... 250/211 R
[58] Field of Search ....................... 250/211 R, 211 K; 330/289

[56] References Cited

FOREIGN PATENT DOCUMENTS 1451231 7/1966 France .
1600335 7/1970 France .
2027100 9/1970 France .
145275 3/1977 Japan .

OTHER PUBLICATIONS

Patents Abstracts of Japan, vol. 2, No. 26, Fevrier 20, 1978, p. 11789 E 77 & JP-A-52 145 275 (Fujitsu K.K.) (03-12-1977).

Primary Examiner—Gene Wan
Attorney, Agent, or Firm—Roland Plottel

[57] ABSTRACT

A photodetector which uses a photoconductive layer for detection is provided with a load resistor which is a layer of the same material and shares the same substrate as the photoconducting layer for temperature compensation. The resistor layer is shielded from the radiation being detected while the photoconductive layer is exposed to the radiation. Advantageously, each layer has the same intrinsic resistance but the resistance layer is a scaled up transformation of the photoconducting layer.

5 Claims, 3 Drawing Figures

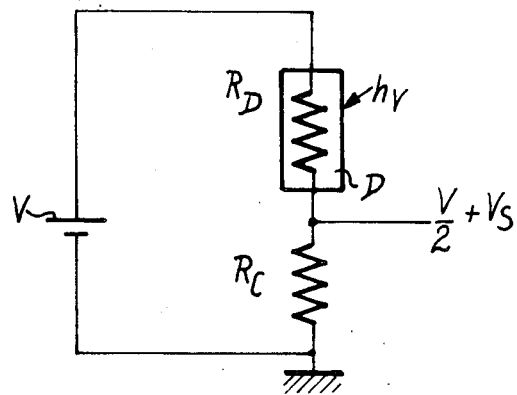
FIG_1 PRIOR ART
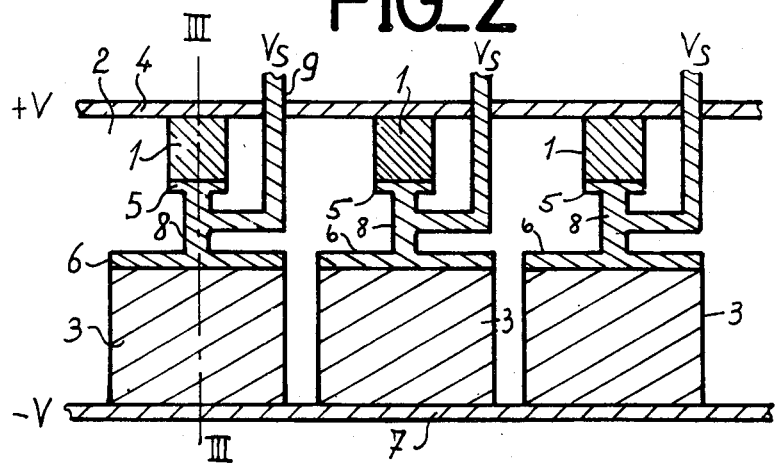
FIG_2
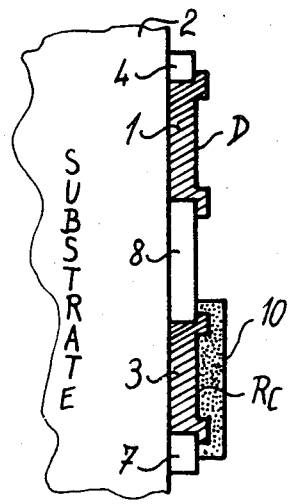
FIG_3 ions also depends on the temperature. See below.

PROCESS FOR THE TEMPERATURE COMPENSATION OF A PHOTOCONDUCTING DETECTOR

BACKGROUND OF THE INVENTION

1. Field of the Invention

The present invention relates to photoconducting detectors. Such detectors are widely used in optoelectronics for detecting electromagnetic radiation, more especially for detecting electromagnetic radiation whose wavelength falls within the visible light range and especially the infrared range.

It will be recalled first of all that photoconducting detectors use the increase in electric conductivity of a semiconductor when this latter is subjected to illumination by electromagnetic radiation such as defined above. When the detector is subjected to such illumination, an increase in the number of free carriers can be observed in the conducting band. Now, the number of free carriers is proportional to $\exp(-E_G/kT)$ with:

$E_G$ the energy of the prohibited band k Boltzmann's constant and,

T the temperature

It can then be seen that the number of carriers also depends on the temperature. Consequently, a variation in the ambient temperature causes a variation in the number of carriers in the conducting band in the same way as illumination by electromagnetic radiation. The carrier variation due to the temperature becomes very rapidly equivalent to that due to illumination, particularly in the case of semiconductors with small prohibited band. In this case, in fact, the variation of the number of carriers in the conducting band with respect to the number of carriers already present is small. However, the variation due to the temperature is a variation which evolves slowly with time. Also, in order to be able to distinguish the variations in the number of carriers due to the temperature from those due to illumination, the illumination is modulated and so a useful modulated signal can be detected at the output.

However, this problem of variation in the number of carriers due to the temperature is very important when it is desired to detect a DC signal, namely when it is impossible to modulate the illumination.

2. Description of the Prior Art

With photoconducting detectors, the circuit shown in FIG. 1 is preferably used for reading the useful signal corresponding to the illumination received. This circuit comprises a voltage source V to which the photoconducting detector D formed by a semiconductor volume with two ohmic contacts and a load resistor Rc are connected in series. The useful signal is detected at the terminals of the load resistor, one of which corresponds to the node between the photoconductor and load, the other of which to a voltage source terminal.

With this type of circuit, the useful signal is superimposed on a voltage which is often much greater than said signal and, if it is desired to detect the DC signal, this voltage must be subtracted, which implies a great stability thereof.

Now, when the temperature changes, a variation in the number of carriers can be observed in the photoconducting detector as explained above, that is to say a variation of the resistivity which is inversely proportional to the number of free carriers and consequently a variation in the resistance of the detector which varies exponentially according to an approximate law of $\exp(-E_G/kT)$ whereas the load resistor has negligible variation as a function of the temperature.

The purpose of the present invention then is to allow a DC signal to be read while overcoming this disadvantage.

SUMMARY OF THE INVENTION

The present invention provides then a process for the temperature compensation of a photoconducting detector, whose voltage is read by means of a load resistor connected in series with said detector, wherein the load resistor is in the form of a volume or element of the same material as the detector, disposed in the vicinity thereof and it is coated with an insulating cover opaque to the electromagnetic radiation to be detected.

In this case, the load resistor undergoes the same temperature variation as the detector. Since this latter is in addition adjoining the detector, the voltage of the middle point or mode therebetween is then independant of the temperature.

However, when an element is constructed from a semiconductor material, two types of noise are observed, namely Johnson's noise which is independent of the material and generation-recombination noise whose mean power is inversely proportional to the semiconductor volume considered. In fact, since the thickness of the detector is generally chosen equal to the absorption length of the electromagnetic radiation to be detected, the detector is made according to the thin layer technique and the troublesome generation-recombination noise voltage is inversely proportional to the square root of the area of the detector.

Consequently, if the load resistor is of the same size as the detectors, it provides the same noise and the detectivity of the detector is lowered by a factor of $\sqrt{2}$. Consequently, according to one feature of the present invention, the area of the load resistor is obtained by an increasing homothetic or scaled transformation of the area of the photoconducting detector, so as to provide an excess noise which is negligible compared with that of the detector alone. For example, if the area of the load resistor is four times that of the detector, the detectivity is only lowered by a factor $\sqrt{1+\frac{1}{4}} = 1.22$.

BRIEF DESCRIPTION OF THE DRAWINGS

Other features and advantages of the present invention will appear from reading the following description made with reference to the accompanying drawings in which:

FIG. 1, already described, is an electric diagram of a voltage read photoconducting detector;

FIG. 2 is a top view of a part of a temperature compensated photoconducting detector strip in accordance with the present invention; and FIG. 3 is a sectional view through III—III of FIG. 2.

DESCRIPTION OF THE PREFERRED EMBODIMENT

The present invention will be described in greater detail with reference to photoconducting detectors formed as thin layers and more especially to detectors formed for example from lead sulphide, lead selenide, cadmium sulphide, cadmium selenide, cadmium sulphide, cadmium selenide or with ternary compounds such as cadmium and lead sulphide, etc.

As shown in FIGS. 2 and 3, three photoconducting detectors 1, made for example from lead sulphide, have been formed on a glass or ceramic substrate 2 using the thin layer technology.

Each detector is formed, solely by way of illustration, by a square having sides of 100 microns and a thickness essentially equal to the absorption length of the electromagnetic radiation to be detected. In accordance with the present invention, a load resistor 3 adjacent each detector 1 is made from the same material as this latter. Thus, the load resistor varies as a function of the temperature like the internal resistance of the photoconducting detector 1. Furthermore, the area of the load resistor 3 is obtained by scaling up the area of detector 1 and is formed, in the present case, by a square whose sides have a length double that of the square forming the detector. Metal contacts 4 to 7 are provided on each side or end of the detector and of the load resistor which are mounted in series by means of a metal conductor 8, the useful signal being obtained from the metal conductor 9 connected to conductor 8, which corresponds to the node between the photoconductor and the resistor. Preferably, the contacts 4 and 7 are at $+V$ and $-V$ voltages so as to eliminate drifting of the supply voltage.

On the other hand, as shown in greater detail in FIG. 3, a cover 10 made from an insulating material opaque to the radiation to be transmitted covers the load resistor. The cover may be formed by a layer of silicon oxide coated with a metal layer such as aluminium or else the cover may be formed by using a silk screen printing ink.

Through using a load resistor made from the same material as the detector and having a larger area, temperature compensation of the detector is thus provided without lowering its performance at the level of the added generation-recombination noise, as explained in the introduction.

In the above described case, the photoconducting detector and its associated load resistor are formed by using any of the processes for constructing thin layer photoconducting detectors.

What is claimed is:

1. A photodetector comprising an output mode terminal and a pair of voltage supply terminals, a photoconductor means having first and second ends of which the first is connected to one of the voltage supply terminals and the second to the output mode terminal, a resistor means having first and second ends of which the first is connected to the other of the voltage supply terminals and the second to the output mode terminal, the photoconductor and resistor means each comprising a separate layer of the same semiconductor materials on a common substrate, the layer of the photoconductor means being open to incident radiation to be detected, the layer of the resistor means being closed to such radiation.

2. A photodetector in accordance with claim 1 in which the resistor means and the photoconductor means have essentially the same intrinsic resistance.

3. A photodetector in accordance with claim 2 in which the two layers are of uniform thickness but the area of resistor layer is a scaled up transformation of the area of the photoconductor means.

4. A photodetector in accordance with claim 3 in which the thickness of each layer corresponds essentially to the absorption length of the incident radiation in the photoconductor means.

5. A photodetector in accordance with claim 4 in which the layers are of a compound semiconductor useful for the detection of infrared radiation.

* * * * *